United States Patent
Vais et al.

(10) Patent No.: US 11,355,618 B2
(45) Date of Patent: Jun. 7, 2022

(54) LOW PARASITIC CCB HETEROJUNCTION BIPOLAR TRANSISTOR

(71) Applicant: IMEC VZW, Leuven (BE)

(72) Inventors: Abhitosh Vais, Heverlee (BE); Liesbeth Witters, Lubbeek (BE); Yves Mols, Wijnegem (BE)

(73) Assignee: IMEC VZW, Leuven (BE)

( * ) Notice: Subject to any disclaimer, the term of this patent is extended or adjusted under 35 U.S.C. 154(b) by 25 days.

(21) Appl. No.: 17/103,031

(22) Filed: Nov. 24, 2020

(65) Prior Publication Data

US 2021/0167187 A1 Jun. 3, 2021

(30) Foreign Application Priority Data

Nov. 29, 2019 (EP) ..................................... 19212493

(51) Int. Cl.
*H01L 29/66* (2006.01)
*H01L 29/08* (2006.01)
(Continued)

(52) U.S. Cl.
CPC .... *H01L 29/66318* (2013.01); *H01L 29/0826* (2013.01); *H01L 29/7371* (2013.01); *H01L 21/30612* (2013.01); *H01L 29/205* (2013.01)

(58) Field of Classification Search
CPC ........... H01L 29/66318; H01L 29/0826; H01L 29/7371; H01L 21/30612; H01L 29/205;
(Continued)

(56) References Cited

U.S. PATENT DOCUMENTS 9,318,325 B2 * 4/2016 Bai ...................... H01L 21/0262
10,431,591 B2 10/2019 Goda et al.
(Continued)

FOREIGN PATENT DOCUMENTS

WO 2008039534 A2 4/2008

OTHER PUBLICATIONS

Li, Defect reduction of GaAs/Si epitaxy by aspect ratio trapping, Journal of Applied Physics 103, 106102 (2008) (Year: 2008).*
(Continued)

*Primary Examiner* — Syed I Gheyas
(74) *Attorney, Agent, or Firm* — McDonnell Boehnen Hulbert & Berghoff LLP

(57) ABSTRACT

A method for fabricating a heterojunction bipolar transistor (HBT) comprises providing a semiconductor support layer and forming an even number of at least four elongated wall structures on the support layer. The wall structures are arranged side-by-side at a regular interval. An odd number of at least three semiconductor collector-material ridge structures are formed on the support layer. Each ridge structure is formed between two adjacent wall structures. A semiconductor base-material layer is formed on a determined ridge structure of the at least three ridge structures. A semiconductor emitter-material layer is formed on the base-material layer. The base-material layer is epitaxially extended so that it coherently covers all the wall structures and all the ridge structures. All the ridge structures except for the determined ridge structure are selectively removed.

20 Claims, 6 Drawing Sheets

(51) Int. Cl.
*H01L 29/737* (2006.01)
*H01L 21/306* (2006.01)
*H01L 29/205* (2006.01)

(58) Field of Classification Search
CPC ............ H01L 29/0821; H01L 29/0817; H01L 29/0649; H01L 29/1004; H01L 29/7378
See application file for complete search history.

(56) References Cited

U.S. PATENT DOCUMENTS

| | | | | |
|---|---|---|---|---|
| 2003/0168002 | A1* | 9/2003 | Zaidi | H01L 21/0265 117/101 |
| 2006/0169987 | A1* | 8/2006 | Miura | H01L 21/0245 257/79 |
| 2011/0049568 | A1* | 3/2011 | Lochtefeld | H01L 27/092 257/190 |
| 2014/0084420 | A1 | 3/2014 | Adkisson et al. | |
| 2015/0137185 | A1 | 5/2015 | Camillo-Castillo et al. | |
| 2019/0157434 | A1 | 5/2019 | Balakrishnan et al. | |
| 2020/0091322 | A1* | 3/2020 | Balakrishnan | H01L 21/02532 |

OTHER PUBLICATIONS

Fiorenza, Aspect Ratio Trapping: a Unique Technology for Integrating Ge and III-Vs with Silicon CMOS, EOS Transactions, 33 (6) 963-976 (2010) (Year: 2010).*

Orzali, GaAs on Si epitaxy by aspect ratio trapping: Analysis and reduction of defects propagating along the trench direction, J. Appl. Phys. 118, 105307 (2015) (Year: 2015).*

Kunert, How to control defect formation in monolithic III/V heteroepitaxy on (100) Si? A critical review on current approaches, Semicond. Sci. Technol. 33 (2018) 093002 (19pp) (Year: 2018).*

Extended European Search Report and Written Opinion, EP Application No. 19212493.1, dated May 15, 2020, 9 pages.

* cited by examiner

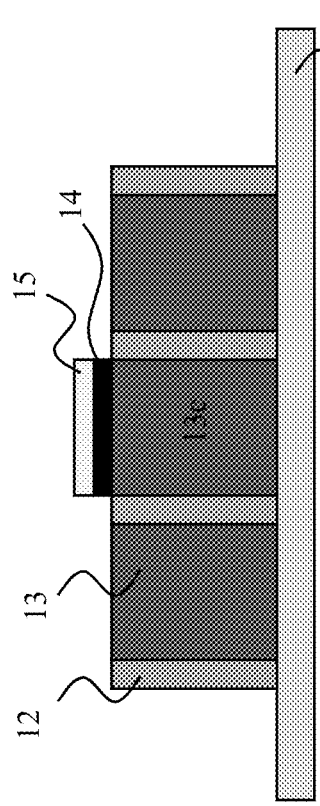
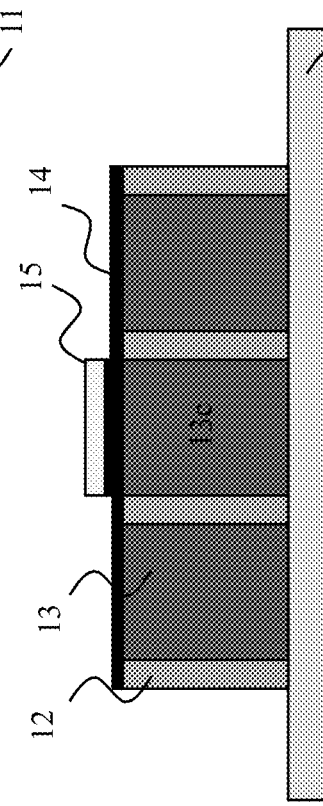
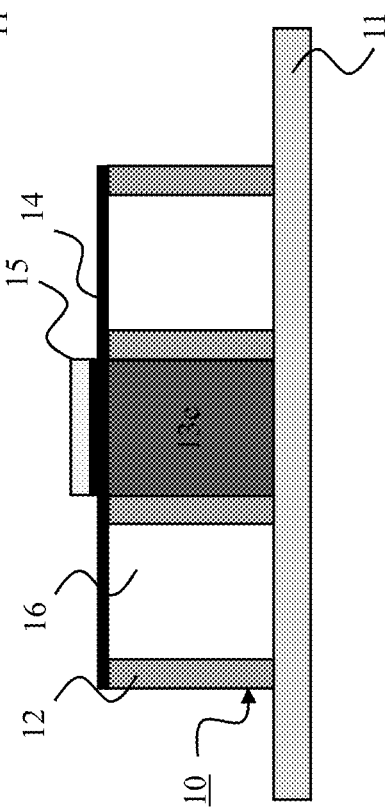

LOW PARASITIC CCB HETEROJUNCTION BIPOLAR TRANSISTOR

CROSS-REFERENCE TO RELATED APPLICATIONS

The present application is a non-provisional patent application claiming priority to European Patent Application No. EP 19212493.1, filed Nov. 29, 2019, the contents of which are hereby incorporated by reference.

FIELD OF THE DISCLOSURE

This application relates to a heterojunction bipolar transistor (HBT), and in particular, an HBT fabricated using aspect ratio trapping (ART) technology in semiconductor ridge structures, such as nanoridges. Disclosed herein is a method for fabricating such an HBT, and corresponding HBT embodiments formed according to the method. Example HBTs disclosed herein have a very low parasitic base-collector capacitance.

BACKGROUND

Two of the primary performance metrics for an HBT for radio frequency (RF) applications are the cut-off frequencies for maximum current gain, $F_t$, and power gain, $F_{max}$, respectively. As consumer requirements continue to push higher, parasitic capacitances and resistances are becoming the most critical factors in limiting HBT performance. In particular, the base-collector (depletion) capacitance, $C_{cb}$, is one of the most critical parasitic capacitances, because it affects both $F_t$ and $F_{max}$.

FIG. 6 illustrates a conventional HBT 60, which comprises a sub-collector region 61, a collector region 62 arranged on the sub-collector region 61, a base region 63 arranged on the collector region 62, and an emitter region 65 arranged on the base region 63. The emitter region 65 is narrower than the base region 63 to provide space to form base contacts 64 contacting the base region 63 next to the emitter region 65. The emitter region 65, and the parts of the base region 63 and the collector region 62 located beneath the emitter region 65, together form the active (transistor) area of the HBT 60.

The parasitic $C_{cb}$ is indicated in FIG. 6 beneath the base contacts 64. The parasitic $C_{cb}$ could be reduced by eliminating the part of the collector region 62 that is located underneath the base contacts 64, since this part of the collector region 62 is not part of the active transistor area. However, the challenge in controlling, and in particular reducing, the value of the parasitic $C_{cb}$ for an optimized performance of the HBT 60 is twofold.

Firstly, scaling the width of the collector region 62 would limit the space for the base contacts 64, thereby severely limiting the base resistance, $R_{bb}$, which would adversely affect $F_{max}$. Secondly, selectively etching out the unwanted parts of the collector region 62 is not only difficult, but also limits the stability of the HBT and thus its yield, especially in the case of a Schottky HBT (SHBT), where this is not a suitable solution in a traditional process flow.

One conventional approach to reduce the parasitic $C_{cb}$ in an HBT is to deliberately over-etch the collector region 62 in a process flow based on blanket wafers. However, this still leads to significant stability and yield issues.

Another conventional approach to reduce the parasitic $C_{cb}$ in an HBT is the transferred substrate method. In this method, the HBT is fabricated on a blanket substrate up to the formation of the base contacts 64. Afterwards, the HBT is transferred to a host wafer in an upside-down orientation, and is then bonded to the host wafer. Following the removal of a carrier wafer from the top, the collector region can then be patterned to reduce the parasitic $C_{cb}$. However, this is a very complex process, and thus also not the ideal solution in terms of yield.

SUMMARY

In view of the above-mentioned challenges and disadvantages of the conventional approaches, embodiments disclosed herein aim to provide an improved method to fabricate an HBT and to provide an improved HBT. One object of the application is to provide an HBT having enhanced cut-off frequencies for both maximum current gain and power gain. To this end, the aim is to fabricate an HBT with reduced parasitic base-collector capacitance. However, the stability of the HBT should, thereby, not be compromised. Another object of the application is to provide a high fabrication yield.

These objectives are achieved by the embodiments provided in the enclosed independent claims. Various alternative implementations of these embodiments are defined in the dependent claims.

Examples of the HBTs disclose herein are fabricated using the ART technology in ridge structures, in particular using nanoridges.

A first aspect provides a method for fabricating an HBT. The method comprises providing a semiconductor support layer and forming an even number of at least four elongated wall structures on the support layer. The wall structures are arranged side-by-side at a regular interval. The method further comprises forming an odd number of at least three semiconductor collector-material ridge structures on the support layer. Each ridge structure is formed between two adjacent wall structures. The method further comprises forming a semiconductor base-material layer on a determined ridge structure of the at least three ridge structures; forming a semiconductor emitter-material layer on the base-material layer; extending the base-material layer epitaxially so that it coherently covers all the wall structures and all the ridge structures; and selectively removing all the ridge structures except for the determined ridge structure.

The determined ridge structure may be the central ridge structure, i.e., the ridge structure arranged centrally in the odd number of ridge structures arranged next to each other. The formation of the different layers and ridge structures may be implemented by growth or deposition, such as by epitaxial growth. For example, Metalorganic Vapor Phase Epitaxy (MOVPE), Metalorganic Chemical Vapor Deposition (MOCVD) or Molecular Beam Epitaxy (MBE) may be employed.

The method of the first aspect facilitates fabrication of an improved HBT. In particular, since collector-material ridge structures other than the determined ridge structure are removed by the method, the parasitic base-collector (depletion) capacitance, $C_{cb}$, is significantly reduced in the final HBT. The HBT has accordingly extremely low, or possibly even zero, $C_{cb}$. Accordingly, the cut-off frequencies for both the maximum current gain, $F_t$, and the power gain, $F_{max}$, are improved for the HBT.

In an implementation of the method, the semiconductor collector-material and the semiconductor emitter-material comprise a first-conductivity-type III-V semiconductor material, and the base-material comprises a second-conductivity-type III-V semiconductor material.

The III-V semiconductor material allows a well-controlled formation or growth of the ridge structures. The ridge structures may be grown using the ART technology, wherein the ridge structures may be nanoridges.

In an implementation of the method, the wall structures comprise a silicon oxide, and/or the semiconductor support layer comprises a silicon-based layer.

In an implementation of the method, the forming of each ridge structure is confined in and guided by a trench formed in the support layer.

In an implementation, the method further comprises forming each ridge structure in a V-groove, wherein the V-groove is disposed in the support layer.

The support layer trench and/or V-groove are characteristic for the ART technology. Defects can be trapped in a lower part of the ridge structures, and the parts of the ridge structures above can be made more or less defect-free.

In an implementation of the method, extending the base-material layer comprises epitaxially growing base-material on ridge structures other than the determined ridge structure until the base-material merges together over the wall structures and with the base-material layer formed on the determined ridge structure. This provides a simple but efficient way to extend the base-material layer.

In an implementation of the method, removing the ridge structures comprises selectively etching the semiconductor collector-material using wet chemistry. Thus, the material responsible for the parasitic $C_{cb}$ can be easily and efficiently removed.

In an implementation, the method further comprises, before extending epitaxially the base-material layer, forming an etch-stop layer, such as a not-intentionally-doped III-V semiconductor etch-stop layer, on each ridge structure other than the determined ridge structure.

In an implementation, the method further comprises, after removing the ridge structures, removing the etch-stop layers by selectively etching using wet chemistry. For instance, for forming the etch-stop layer, a thin InGaP re-growth under the extended base-material layer can be performed. The etch-stop layer protects the extended base-material layer from getting etched during the above-described collector-material ridge structure removal. In this way, the base-collector junction can be completely removed under the extended base-material layer, and therefore, $C_{cb}$ can be reduced to zero.

In an implementation, the method further comprises, before removing the ridge structures, forming a protective layer on the base-material layer and on the emitter-material layer of the ridge structure, respectively. This protects the top surface of these layers from the processing that removes the ridge structures and, therefore, leads to higher stability and yield.

In an implementation of the method, forming the ridge structures comprises, for each ridge structure, forming a narrower ridge portion to confine all defects on the support layer, and forming a wider defect-free ridge portion on top of the narrower ridge portion. The forming of the wider ridge portion is guided by the corresponding two adjacent wall structures. This improves the performance of the HBT, since the collector-material ridge structure that remains from the active transistor area is of high quality. The wall structures act as a template to grow the ridge structures, and benefit the stability of the final HBT.

In an implementation of the method, epitaxially forming the ridge structures comprises, for each ridge structure, forming a sub-collector region on the support layer and forming a collector region on the sub-collector region.

In an implementation, the method further comprises filling spaces formed by removing the ridge structures with an insulator material or air. Suitable insulator materials may further improve the stability of the HBT without adding parasitic $C_{cb}$.

A second aspect provides an HBT fabricated using the method according to the first aspect or any implementation thereof.

The HBT of the second aspect is clearly distinguishable from an HBT formed by another method. For instance, remainders of the collector-material ridge structures may remain in the support layer (e.g., in trenches). Further, the wall structure template that provides stability to the HBT is not present in other HBTs. The method of the second aspect provides an HBT with all the advantages explained with respect to the first aspect.

A third aspect provides an HBT, comprising a semiconductor support layer and an even number of at least four elongated wall structures arranged on the support layer. The wall structures are arranged side-by-side at a regular interval. A semiconductor collector-material ridge structure is arranged on the support layer. The ridge structure is arranged between two determined adjacent wall structures of the at least four wall structures. A semiconductor base-material layer is arranged on the ridge structure and over the wall structures. The base-material layer is supported by the wall structures. A semiconductor emitter-material layer is arranged above the ridge structure on the base-material layer. Spaces between the wall structures other than the two determined adjacent wall structures are filled with air and/or with an insulator material.

The determined adjacent wall structures may, for example, be the central adjacent pair of all possible adjacent pairs of wall structures, which are arranged next to each other on the support layer. The wall structures support the base-material layer and provide stability to the HBT. That is, the HBT is very stable even though there is no collector-material below the base-material layer adjacent to the determined ridge structure. The HBT has, accordingly, extremely low or even zero $C_{cb}$. Accordingly, the cut-off frequencies for maximum current gain, $F_t$, and power gain, $F_{max}$, are improved.

In an implementation of the HBT, the active transistor area is formed by the collector-material ridge structure, the base-material layer arranged on the ridge structure, and the emitter-material layer arranged on the base-material layer.

The HBT of the third aspect can have implementation forms corresponding to the implementation forms of the method of the first aspect, i.e., it may comprise the further structural features provided by these implementation forms of the method.

In summary, by using, e.g., the ART approach to form the ridge structures, the base-material layer can be separately formed around, but outside, the active transistor area. Thus, space is provided to form base contacts to the base-material layer. The template of the wall structures provides the necessary stability to the HBT. Further, the extended base-material can be made independent of the parasitic base-collector junction, which leads to easier scaling control over the base parasitics.

BRIEF DESCRIPTION OF THE FIGURES

The above, as well as additional features, will be better understood through the following illustrative and non-limiting detailed description of example embodiments, with reference to the appended drawings.

FIGS. 1A-1C show an HBT during different steps of an HBT fabrication method, in accordance with example embodiments.

Figure 2:
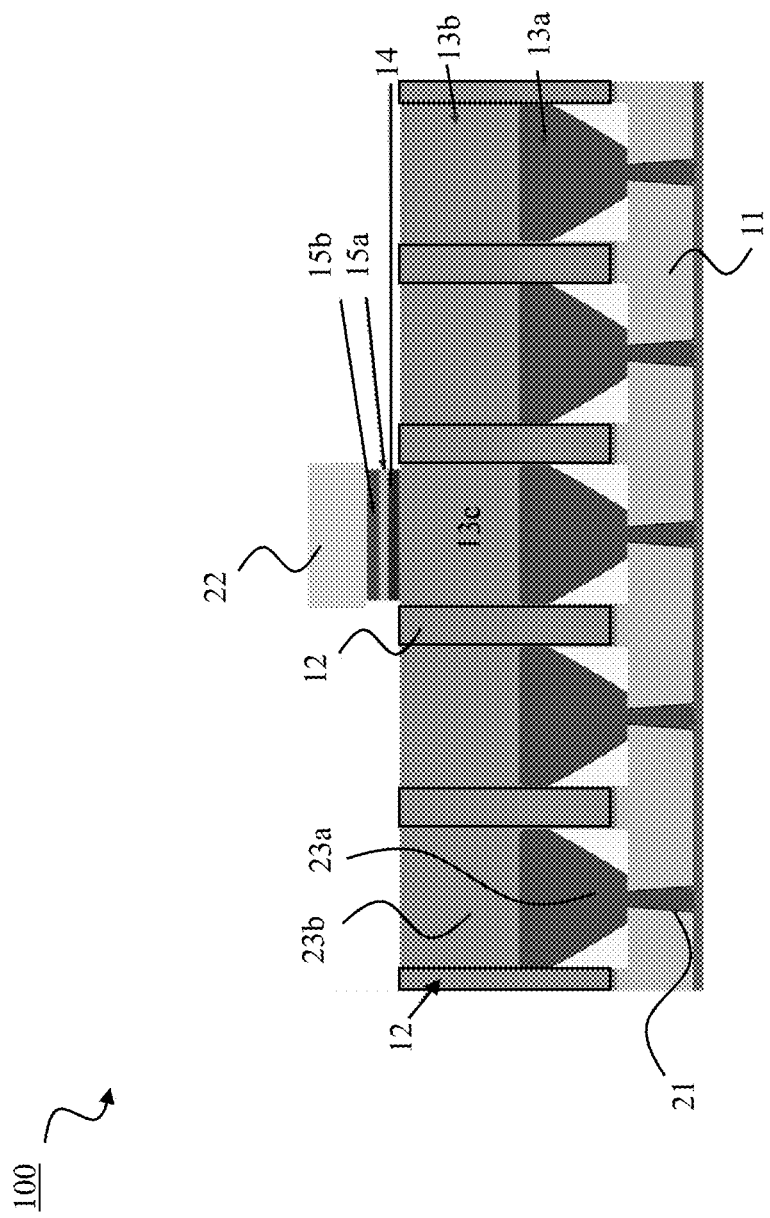
FIG. 2 shows ridge structures formed on a support layer of the HBT, in accordance with example embodiments.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

FIGS. 1A-1C show an example of an HBT during different steps of an HBT fabrication method. The method 100 is suitable to fabricate an HBT 10, and in particular to fabricate an HBT 10 with very low or even zero parasitic base-collector capacitance $C_{cb}$.

The method 100 comprises the following steps. In a first step, a semiconductor support layer 11 or substrate or wafer is provided. In a second step, an even number of at least four elongated wall structures 12 are formed on the support layer 11. That is, for example, four, six, eight, ten, or more, wall structures 12 are formed. The wall structures 12 are arranged side-by-side at a regular interval, i.e., with the same distance between each two adjacent wall structures 12. The wall structures 12 may all extend into the same direction and may thus be arranged in parallel. In a third step, an odd number of at least three semiconductor collector-material ridge structures 13 are formed on the support layer 11. That is, for example, three, five, seven, nine, or more ridge structures 13 are formed. Each ridge structure 13 is formed between two adjacent wall structures 12. These adjacent wall structures 12 may guide the growth of the ridge structure 13.

In a fourth step, a semiconductor base-material layer 14 is formed on a determined ridge structure 13c of the at least three ridge structures 13, or between two determined adjacent wall structures 12. The determined ridge structure 13c may be a central ridge structure (e.g., in the case of three ridge structure 13 it may be the middle ridge structure), and/or may be formed between the central adjacent pair of the wall structures 12 (e.g., in case of four wall structures 12 it may be formed between the two inner wall structures 12. The forming of ridge structures 13 may be confined in and guided by a trench or groove, e.g., V-groove, formed in the support layer 11. Thus, the ridge structures 13 can be formed using the ART technology.

In a fifth step, a semiconductor emitter-material layer 15 is formed on the base-material layer 14. The first to fifths steps lead to the intermediate structure shown in FIG. 1A.

In a sixth step, the base-material layer 14 is epitaxially extended so that it coherently covers all the wall structures 12 and all the ridge structures 13. This sixth step leads to the intermediate structure shown in FIG. 1B. The sixth step may be performed by epitaxially growing base-material on the ridge structures 13, other than the determined ridge structure 13c, until the base-material merges together over the wall structures 12 and with the base-material layer 14 formed on the determined ridge structure 13c.

In a seventh step, all the ridge structures 13 except for the determined ridge structure 13c are selectively removed. This seventh step leads to the finally fabricated HBT 10 that is shown in FIG. 1C. The seventh step may be performed by selectively etching the semiconductor collector-material using wet chemistry.

The fabricated HBT 10 shown in FIG. 1C, accordingly, comprises the semiconductor support layer 11, and the at least four elongated wall structures 12 arranged on the support layer 11. The wall structures 12 are arranged side-by-side at a regular interval. Further, the HBT 10 comprises the determined semiconductor collector-material ridge structure 13c arranged on the support layer 11. The determined ridge structure 13c is arranged between the two determined adjacent wall structures 12 of the at least four wall structures 12. Further, the HBT 10 comprises the (extended) semiconductor base-material layer 14 arranged on the determined ridge structure 13c and over the wall structures 12. The base-material layer is supported by the wall structures 12, and the semiconductor emitter-material layer 15 arranged above the ridge structure 13c on the base-material layer. In the spaces 16 formed between the wall structures 12 other than the two determined adjacent wall structures 12 (formed by removing the collector material ridge structures 13 other than the determined ridge structure 13c) are filled with air and/or with an insulator material.

The primary difficulty in controlling the parasitic $C_{cb}$ of the base-collector region in an HBT is separating the formation (e.g., growth) and the processing of the base-material with respect to the collector-material. The parasitic collector-material needs to be removed with good control, e.g., control over the extent of etching, without etching or otherwise negatively affecting the stability of the base-material. In, for example, a conventional HBT based on blanket epitaxial growth and processing, this is not only difficult to achieve, but in the case of an SHBT, not a viable solution at all.

However, in the embodiments, by forming the ridges structures 13, for example, using ART based growth of collector-material, the above-mentioned difficulty can be inherently overcome due to the separation of each ridge structure 13 by a wall structure 12 (acting as a template barrier). As a result, a single determined ridge structure 13c can be used for the active transistor area, while the nearby ridge structures 13 can still be separately processed (here removed). This separation can lead to zero parasitic $C_{cb}$, namely by removing all the collector-material from the ridge structures 13 surrounding the determined ridge structure 13c.

The base-material layer 14 around the active transistor area can be created by over-growing the ridge structures 13 and wall structures 12 to facilitate a merging of the base-material across different ridge structures 13. The separation between the base-material and collector-material, to ensure selective removal of only the collector-material, may be achieved by growing a (very thin) etch-stop layer 31, particularly from a material known to have a high selectivity towards a solution used to etch.

Figure 3:
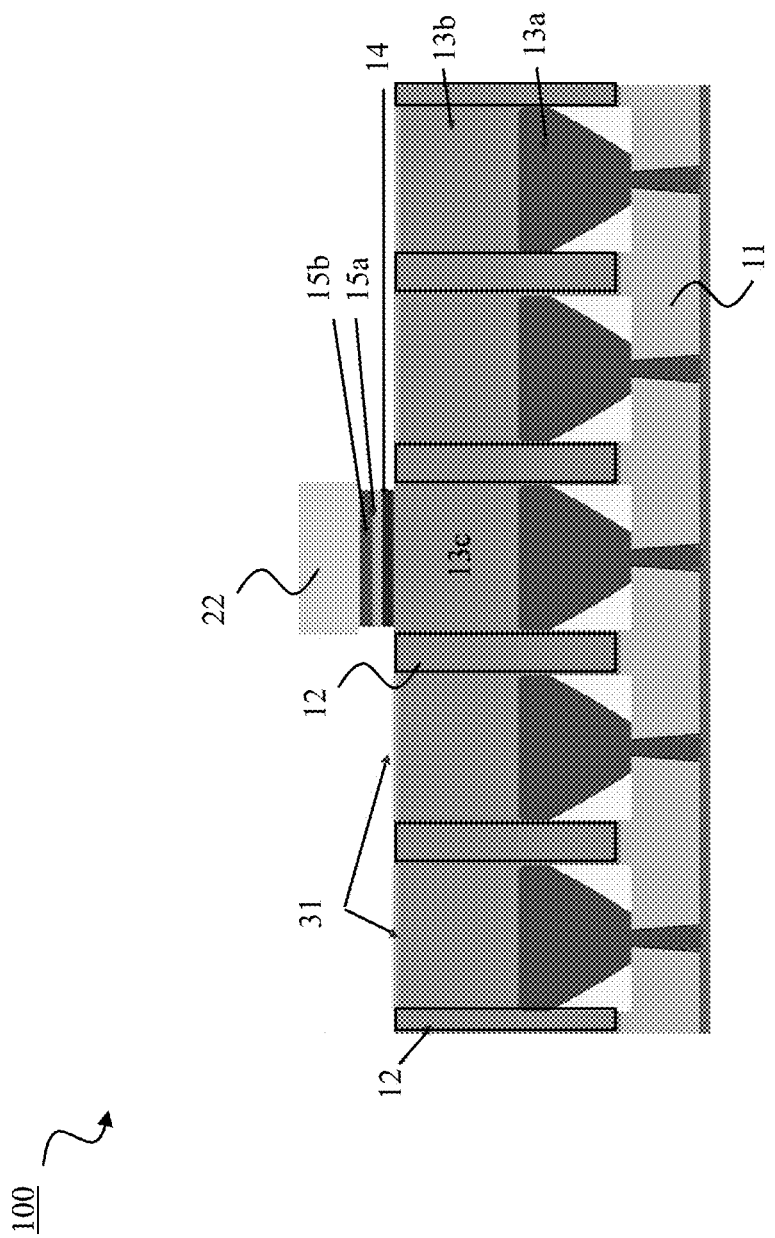
FIG. 3 shows an etch-stop layer formed or grown on an exposed collector-material surface, in accordance with example embodiments.
Figure 4:
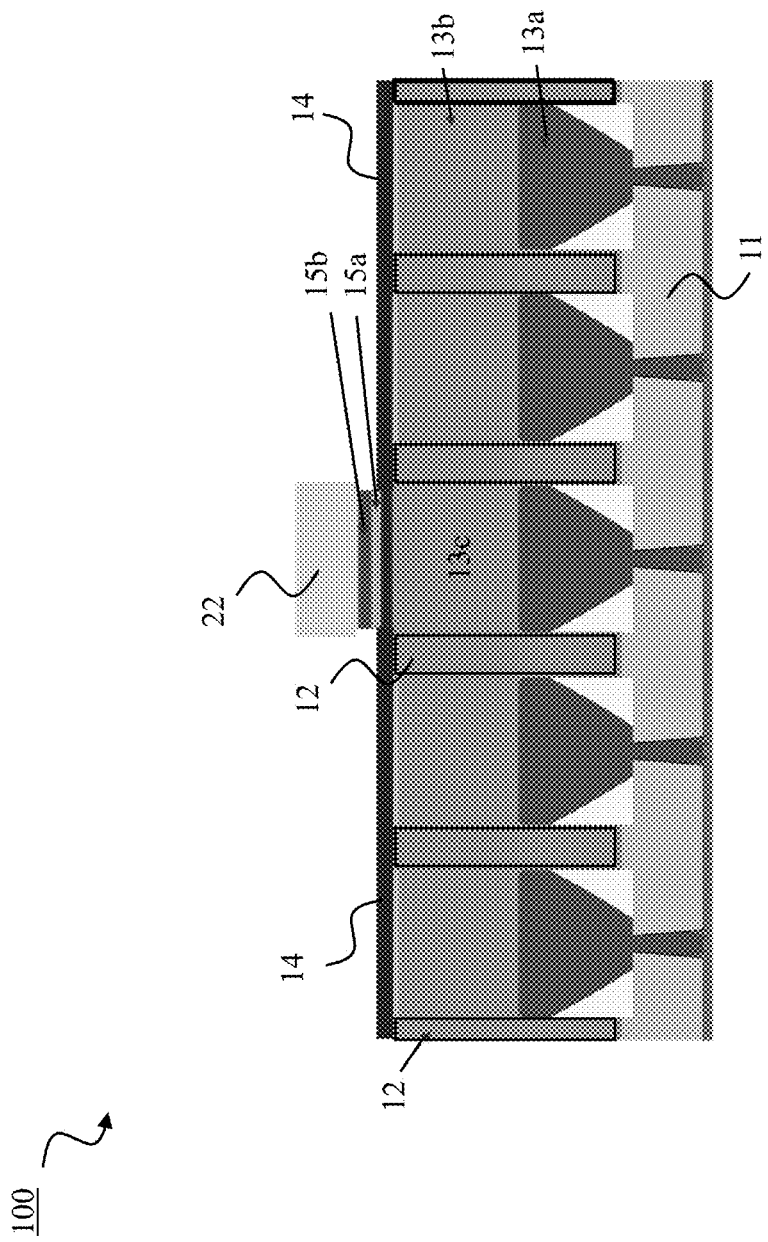
FIG. 4 shows a base-material layer epitaxially extended onto the etch-stop layer, in accordance with example embodiments.
Figure 5:
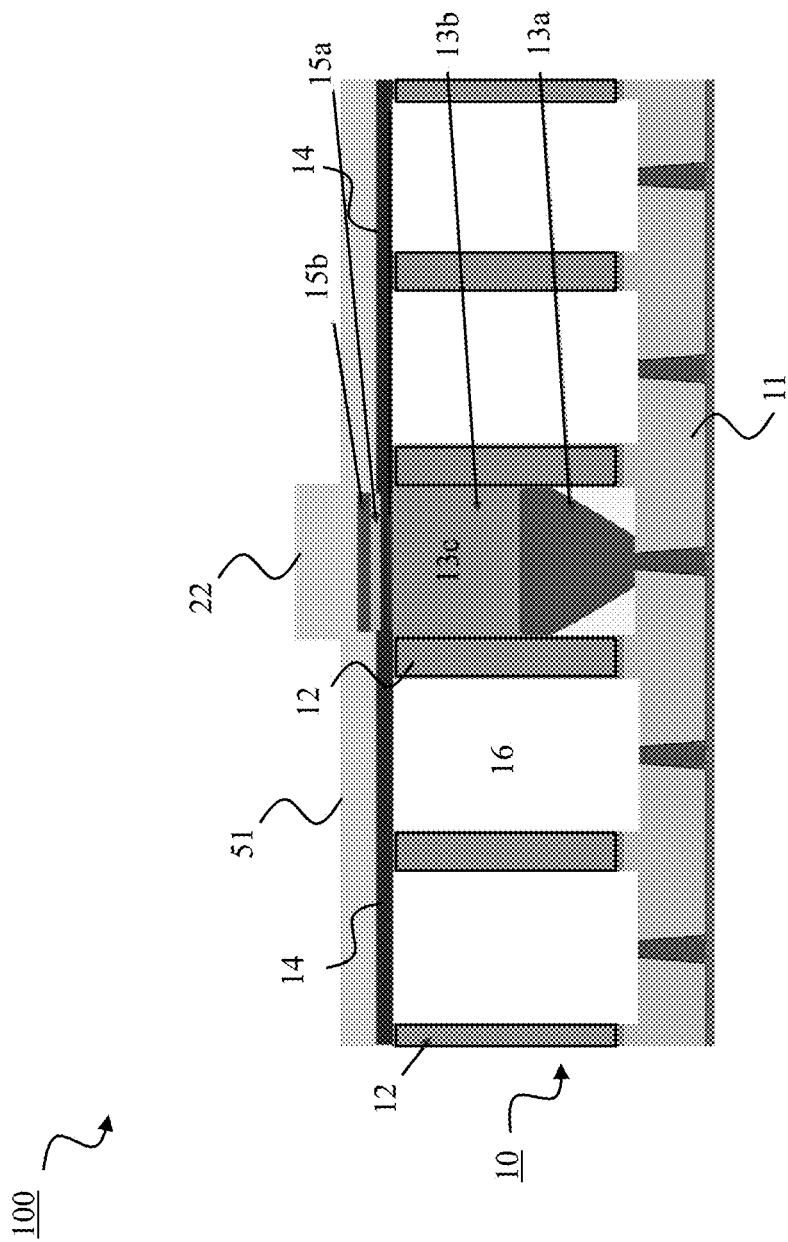
FIG. 5 shows a protective layer that extends from a protective cap to the extended base-material layer, in accordance with example embodiments.
Figure 6:
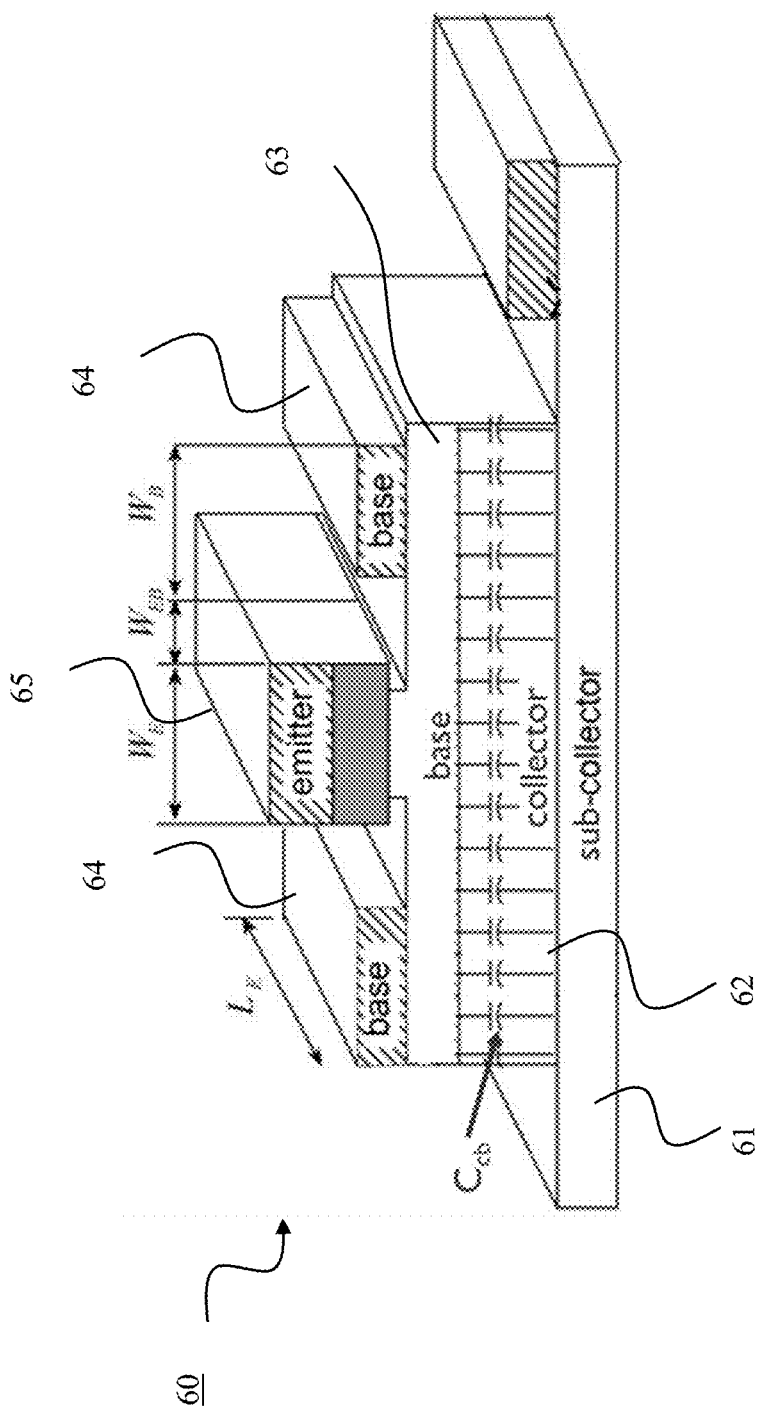
FIG. 6 shows a conventional HBT.

In this respect, FIGS. 2-5 show more details of the method 100 according to an embodiment, which builds on the embodiment of the method 100 shown in FIGS. 1A-1C. That is, the method 100 is exemplarily shown in FIGS. 2-5 with more specific and/or additional steps and features. Same elements in FIGS. 1A-1C and in FIGS. 2-5 are labeled with the same reference signs and function likewise. In particular, an HBT 10 according to an embodiment, as shown in FIG. 5, can finally be obtained by using the illustrated process flow.

In FIG. 2, the ridge structures 13 are formed on the support layer 11 and between the wall structures 12 that are provided on the support layer 11. In particular, they may be grown epitaxially.

Further, an active transistor area is then formed from the determined collector-material ridge structure 13c, the base-material layer 14 arranged on the ridge structure 13c, and the emitter-material layer 15 arranged on the base-material layer 14. A protective cap 22 may further be provided on the base-material layer 14. The semiconductor emitter-material may comprise a first-conductivity-type III-V semiconductor material (e.g., including an n-doped InGaP emitter 15a and an n++-doped GaAs emitter cap 15b). The semiconductor base-material may comprise a second-conductivity-type III-V semiconductor material (e.g., p-doped GaAs). The semiconductor collector-material may comprise a first-conductivity-type III-V semiconductor material (e.g., including an n-doped GaAs collector region 23b and an n+-doped GaAs sub-collector region 23a). The active transistor area may be defined by etching, for example, by using a resist with/without $SiO_2$ as a hard mask. In this case, the emitter-material, the base-material, and the $SiO_2$ mask may be provided on top of and over all ridge structures 13 and all wall structures 12, respectively, and may then be etched until the semiconductor collector-material of the ridge structures 13 is reached. Thereby, the pillar-like structure may be formed above the determined ridge structure 13c, as shown in FIG. 2. A spacer layer may further be provided to protect this area from further processing.

FIG. 3 shows further that an etch-stop layer 31 (e.g., a thin InGaP layer) may be formed or grown on the exposed collector-material surface, i.e., on the ridge structures 13 and wall structures 12, respectively. The etch-stop layer 31 facilitates a selective etching of the collector-material.

FIG. 4 shows further that the base-material layer 14 can be epitaxially extended, namely by epitaxially growing base-material (e.g., p-doped GaAs) onto the etch-stop layer 31. The base-material may specifically be grown until the base-material merges together over the ridge structures 13 other than the determined ridge structure 13c, and merges together with the base-material layer 14 that is formed on the determined ridge structure 13c. This facilitates good contacting to the base-material layer 14 arranged on the determined ridge structure 13c. The extended base-material layer 14 finally covers coherently all the wall structures 12 and all the ridge structures 13. The extended base-material layer 14 provides space for and facilitates good base contacts.

FIG. 5 shows further that a protective layer 51 may be provided, or may be extended from the protective cap 22, to the extended base-material layer 14. For example, by using a resist. Thereafter, the underlying collector-material of the ridge structures 13 other than the determined ridge structure 13c can be removed, for example, by wet etching. This is then followed by removal of the etch-stop layer 31, for example, again by wet etching.

The embodiments provided in this disclosure are applicable to both an SHBT and Double HBT (DHBT), which may be based particularly on III-V semiconductor materials. De-convoluting the base and collector designs in the HBT 10 opens the possibility of independently optimizing both. In addition, the embodiments result in fewer issues with yield and HBT stability, as is the case with conventional approaches. Also, the embodiments remove the requirement for a substrate transfer for fabricating the HBT 10, which further reduces the process complexity and yield issues. Hence, the embodiments are more suitable for 3D integration of III-V on silicon for RF applications.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for fabricating a heterojunction bipolar transistor, the method comprising:
   providing a semiconductor support layer;
   forming an even number of at least four elongated wall structures on the support layer, wherein the wall structures are arranged side-by-side at a regular interval;
   forming an odd number of at least three semiconductor collector-material ridge structures on the support layer, wherein each ridge structure is formed between two adjacent wall structures;
   forming a semiconductor base-material layer on a determined ridge structure of the at least three ridge structures;
   forming a semiconductor emitter-material layer on the base-material layer;
   extending the base-material layer epitaxially so that the base-material layer coherently covers all the wall structures and all the ridge structures; and
   selectively removing all the ridge structures except for the determined ridge structure.

2. The method according to claim 1, wherein:
   the wall structures comprise a silicon oxide; and/or
   the semiconductor support layer comprises a silicon-based layer.

3. The method according to claim 1, wherein:
   the forming of each of the at least three semiconductor collector-material ridge structures is confined in and guided by a trench formed in the support layer.

4. The method according to claim 1 further comprising:
   forming each ridge structure in a V-groove, wherein the V-groove is disposed in the support layer.

5. The method according to claim 1, wherein extending the base-material layer comprises:
   epitaxially growing base-material on the ridge structures other than the determined ridge structure, until the base-material merges together over the wall structures and with the base-material layer formed on the determined ridge structure.

6. The method according to claim 1, wherein:
the semiconductor collector-material and the semiconductor emitter-material comprise a first-conductivity-type III-V semiconductor material; and
the base-material comprises a second-conductivity-type III-V semiconductor material.

7. The method according to claim 6, wherein:
the wall structures comprise a silicon oxide; and
the semiconductor support layer comprises a silicon-based layer.

8. The method according claim 7, wherein:
the forming of each of the at least three semiconductor collector-material ridge structures is confined in and guided by a trench formed in the support layer.

9. The method according to claim 8 further comprising:
forming each ridge structure in a V-groove, wherein the V-groove is disposed in the support layer.

10. The method according to claim 9, wherein extending the base-material layer comprises:
epitaxially growing base-material on the ridge structures other than the determined ridge structure, until the base-material merges together over the wall structures and with the base-material layer formed on the determined ridge structure.

11. The method according to claim 1, wherein removing the ridge structures comprises:
selectively etching the semiconductor collector-material using wet chemistry.

12. The method according to claim 1, further comprising, before extending epitaxially the base-material layer:
forming an etch-stop layer, in particular a not-intentionally-doped III-V semiconductor etch-stop layer, on each ridge structure other than the determined ridge structure.

13. The method according to claim 12, further comprising, after removing the ridge structures:
removing the etch-stop layers by selectively etching using wet chemistry.

14. The method according to claim 1, further comprising, before removing the ridge structures:
forming a protective layer on the base-material layer and on the emitter-material layer, respectively.

15. The method according to claim 1, wherein forming the ridge structures comprises, for each ridge structure:
forming a narrower ridge portion to confine all defects on the support layer; and
forming a wider defect-free ridge portion on top of the narrower ridge portion, wherein the forming of the wider ridge portion is guided by the corresponding two adjacent wall structures.

16. The method according to claim 1, wherein epitaxially forming the ridge structures comprises, for each ridge structure:
forming a sub-collector region on the support layer and forming a collector region on the sub-collector region.

17. The method according to claim 1, further comprising:
filling spaces formed by removing the ridge structures with an insulator material or air.

18. A heterojunction bipolar transistor fabricated using the method according to claim 1.

19. A heterojunction bipolar transistor, comprising:
a semiconductor support layer;
an even number of at least four elongated wall structures arranged on the support layer, wherein the wall structures are arranged side-by-side at a regular interval;
a semiconductor collector-material ridge structure arranged on the support layer, wherein the ridge structure is arranged between two determined adjacent wall structures of the at least four wall structures;
a semiconductor base-material layer arranged on the ridge structure and over the wall structures, wherein the base-material layer is supported by the wall structures; and
a semiconductor emitter-material layer arranged above the ridge structure on the base-material layer;
wherein spaces between the wall structures other than the two determined adjacent wall structures are filled with air and/or with an insulator material.

20. The heterojunction bipolar transistor according to claim 19, wherein:
an active transistor area is formed by the collector-material ridge structure, the base-material layer arranged on the ridge structure, and the emitter-material layer arranged on the base-material layer.

* * * * *